United States Patent [19]

Ohdomari

[11] Patent Number: 5,539,203
[45] Date of Patent: Jul. 23, 1996

[54] SINGLE ION IMPLANTATION SYSTEM

[76] Inventor: Iwao Ohdomari, 2-9-8, Nagahama, Kanazawa-ku, Yokohama, Kanagawa 236, Japan

[21] Appl. No.: 233,513

[22] Filed: Apr. 26, 1994

[30] Foreign Application Priority Data

Apr. 27, 1993 [JP] Japan .................................. 5-123621

[51] Int. Cl.$^6$ ................................................. H01J 37/317
[52] U.S. Cl. ..................... 250/492.21; 250/309; 250/398
[58] Field of Search .................................... 250/397, 398, 250/492.21, 309

[56] References Cited

U.S. PATENT DOCUMENTS

| | | | |
|---|---|---|---|
| 4,063,091 | 12/1977 | Gee | 250/309 |
| 4,626,690 | 12/1986 | Todokoro et al. | 250/398 |
| 5,182,453 | 1/1993 | Hayashi | 250/309 |
| 5,331,161 | 9/1994 | Ohdomari et al. | 250/309 |
| 5,349,196 | 9/1994 | Amemiya et al. | 250/492.21 |

FOREIGN PATENT DOCUMENTS 84904  9/1993  Japan .

OTHER PUBLICATIONS

Kaiser et al Direct Investigation . . . Physical Review Letters Apr. 1988.
Morita et al Growth of Native Oxide . . . J. Appl. Phys. 68 (3) Aug. 1990.
Yasaka et al Chemical Stability . . . Japanese J. Appl. Phys. Dec. 1991.
Schulz et al Single, Individual . . . Physica Scripta 1991.
Ohdomari et al The Structural Models . . . J. of Non–Crystalline. . . 1987.
Odhomari et al Study of the Interfacial . . J. Appl. Phys. 62(9) Nov. 1987.
Fukuda et al Process Dependence of . . . J. Appl. Phys. 72(5) Sep. 1992.
Schubert Delta Doping of III–V . . . J. Vac. Sci. Technol May/Jun./1990.
Landauer Spatial Variation of . . . IBM Journal Jul. 1957.
Büttiker Four–Terminal Phase . . . Physical Review Letters Oct./1986.
McLennan et al Voltage Drop in . . . Physical Review B Jun. 1991.
Hiramoto et al One–Dimensional GaAs . . . Appl. Phys. Lett. 51(20) Nov. 1987.
Hirayama et al Electronic Transport . . . Physical Review B Mar. 1989.
May et al Alpha–Particle–Induced . . . IEEE Trans. Elect . . . Jan. 1979.
Shino et al Single Event Effects . . . IEEE Trans. Nucl. Sci. Dec. 1986.
Horn et al Nuclear Microprobe . . . IEEE Trans. Nucl. Sci. Feb. 1992.
Noritake et al Site Dependence of Soft . . . Jpn. J. Appl. Phys. Jun. 1992.

(List continued on next page.)

*Primary Examiner*—Bruce C. Anderson
*Attorney, Agent, or Firm*—McGlew and Tuttle

[57] ABSTRACT

The present invention is directed to a low-energy (0 to 100 keV) or high-energy (1 to 4 MeV) single ion implantation system in which single ions are extracted from a focused ion beam or micro-ion beam by beam chopping. The low-energy single ion implantation system has, in combination with a focused ion beam system, an electrostatic deflector for beam chopping (20), an aperture for single ion extraction (21) and an electrode (35) for generating a retarding electric field to make the single ion soft-land on a specimen. The high-energy single ion implantation system has, in combination with an ion microprobe, a Cs sputter source (33) which enables dopant ion implantation and high LET ion irradiation. The single ion implantation method includes a step of implanting the extracted single ions from the both systems into the specimen at a predetermined target position with aiming accuracies of 50 nm$\phi$ and 1.5 µm$\phi$, respectively.

4 Claims, 4 Drawing Sheets

OTHER PUBLICATIONS

Car et al Microscopic Theory of . . . Physical Review Letters May 1984.

Sugino et al Pressure Dependence of . . . Materials Science Forum 1992.

Fischer Single–Particle Tech. Nucl. Intr. & Methods . . . 1991.

Ohdomari et al Ion Microprobe System . . . Nucl. Intr. & Methods . . . 1991.

Sawaragi et al A Focused Beam System . . . J. Vac. Sci Technol Sep./Oct./1991.

SINGLE ION IMPLANTATION SYSTEM

BACKGROUND OF THE INVENTION

The present invention relates to a single ion implantation system which utilizes a focused ion beam (FIB) or micro ion beam (MIB) by an ion microprobe and, more particularly, to a single ion implantation system which permits highly accurate implantation of a single ion or predetermined number of controlled ions into a target area or region with a predetermined high degree of aiming accuracy.

In ultrafine-microstructured devices such as a next-generation insulated gate field effect transistor (MOS FET) of a size below 0.1 µm and a quantizing functional device which is a direct extension of microminiaturization technology, the impurity concentration, carrier density and surface and interface levels decrease to such an extent that they could counted; hence, their fluctuations would exert enormous influence on electrical characteristics of the above-mentioned ultrafine-microstructured devices. For this reason, the implementation of the ultrafine-microstructure calls for extremely high precision controllability of fabrication techniques, but many potential factors which would seriously impair the required controllability, such as damage during fabrication and the influence of hidden impurities, lurk in the fabrication process. Since such ultrafine-microstructured devices could not be implemented unless these factors are cleared away one by one, it is a significant challenge at present to seek fundamental or full elucidation of an elementary process for the manufacture of the ultrafine microstructure and its solid-state character control.

A description will be given of the prior art for solid-state character control of the ultrafine microstructure.

(1) Interface Control

A metal/semiconductor interface is one of main themes in solid-state physics that has been studied for the past tens of years, yet its structure and property have not completely been clarified: for example, even in the case of the Schottky barrier forming mechanism, a number of models have been proposed and no theory has been established so far. Above all, as regards the ohmic contact through which a signal is taken out from a device, even an empirical formula for device simulation has not been obtained yet. The reason for this is that the interface is a region buried in the bulk so that direct measurements of its characteristics are extremely difficult. It is another reason that conventional analysis means for the evaluation of the interface provides only averaged information on nonuniform or inhomogeneous interface resulting from chemical reactions, formation of defects and interdiffusion that are associated with the formation of the interface. In other words, characteristics of the metal/semiconductor interface could not completely be understood without analysis means which permit direct evaluation of the interface at high spatial resolution.

A ballistic-electron-emission microscope (hereinafter abbreviated as BEEM) developed by Kaiser and Bell of JPL in 1988 is an improvement on a scanning tunneling microscope (hereinafter abbreviated as STM) for application to the evaluation of the interface [W. J. Kaiser and L. D. Bell, Phys. Rev. Lett., 60, 1406 (1988)]. The BEEM utilizes the fact that in a metal thin film/semiconductor interface system, those of electrons constituting a tunnel current between the chip and metal of the STM which has reached the metal surface partly conduct through the metal film in a ballistic mode to the metal/semiconductor interface. The BEEM allows measurements of the Schottky barrier height (SBH) in a region within 2 nm through utilization of its voltage-current characteristic. Hence, the BEEM could serve as potent evaluation means for clarifying physical phenomena in the metal/semiconductor interface, but substantially no study is being given the BEEM in Japan. The inventor of this application has made the BEEM for the first time in Japan by modifying the hardware of the STM and started measurements of the Schottky barrier height (SBH) in a Pt/n-Si (100) interface by the BEEM and studies on a microscopic spatial distribution of the Schottky barrier height. With the single ion implantation system according to the present invention, the atomic elementary process of the interface reaction can be made clear by observing the effect of manipulation on the interface by single ion implantation through maximum utilization of the high spatial resolution of the BEEM.

An $SiO_2$/Si interface system has been investigated very actively as the most important constituent of the MOS FET. Recently, with a view toward the formation of an extremely thin gate oxide film for the next generation of MOS FETs, many studies are being made on the silicon surface condition prior to oxidation, the process of formation of natural oxide films [M. Morita, T. Ohmi, E. Hasegawa and M. Ohwada, J. Appl. Phys., 68 (1990) 1272, and T. Yasaka, K. Kanda, K. Sawara, S. Miyazaki and M. Hirose, Jpn. J. Appl. Phys., 30 (1991) 3567] and an extremely thin oxide film forming process through use of photoelectron spectroscopy, infrared absorption spectroscopy, thermal desorption spectroscopy and so forth. As regards the fluctuation of electrical characteristics by the interface level which becomes a discrete quantity with the ultraminiaturization of MOS FETs, the possibility of such fluctuation has been pointed out, besides an example of measurements of capture and emission of electrons by traps commonly referred to as electron noise has been reported [M. Schulz and A. Kramann. Physica Scripta. T35, (1991) 273]. There has not been made any report which demonstrates the clear existence such fluctuations of the electrical characteristics in ultrafine microstructures by introducing the interface level or traps purposely.

With respect to the $SiO_2$/Si interface system, the inventor of this application has tried to gather findings mainly on the atomic arrangement in the interface through use of an ultrahigh resolution electronic microscope and strain or distortion energy calculations based on interfacial structure models [H. Akatsu and I. Ohdomari, J. Non-Grist. Solid., 89 (1987) 239, H. Akatsu and I. Ohdomari, J. Phys., 62 (1987) 3751] and found that a high correlation does not always exist between the interface undulation on an atomic scale and the interface level or trap density. At present, he wonders if the interface level or trap density is not governed rather by factors which have not been subject to control, such as hydrogen (H) in the interface [H. Fukuda, M. Yasuda, S. Kaneko, T. Ueno and I. Ohdomari, J. Appl. Phys., 72 (1992) 1906]. By the single ion implantation in the single ion implantation system and method according to the present invention, it is possible to introduce the interface level of a known density and clarify the behavior by the subsequent heat treatment in a hydrogen atmosphere.

(2) Impurity Control

As regards impurity control, there have been reported a number of examples which succeeded in improving the electrical and optical properties by forming a sheet-like impurity layer (by delta doping) during the crystal growth of a thin film (for example, Schubert [E. F. Schubert, J. Vac. Sci. Technol., A8 (1990) 2980]), but this is essentially control of the impurity distribution in the direction of growth; no report has been made on control of the number of impurity atoms in the ultrafine-microstructure.

The electrical conduction in a one-dimensional fine line or wire structure which is sufficiently small in size (on the order of ~100 nm) in the direction perpendicular to the screen and has a length in the direction of travel to such an extent as not to cause scattering has been studied theoretically by many researchers including Landauer JR. Landauer, IBM J. Res. & Dev. 1, (1957) 223] and Buttiker [M. Buttiker, Phys. Lett., 57 (1986) 1761]. Recently, an interesting study of simulating variations in chemical and electrostatic potentials by impurities of such a system has been conducted by McLennan et al [M. J. McLennan, Y. Lee and D. Datte, Phys. Rev. B43 (1991) 13846].

There are many examples which actually fabricated quantum wires and confirmed the quantum size effect. In Japan, phenomena such as the quantization of conductance has been observed by Ikoma et al. who fabricated wires in a two-dimensional gas through utilization of defects induced by a focused ion beam (FIB) [T. Hiramoto, K. Hirakawa, Y. Iye and T. Ikoma, Appl. Phys. Lett., 51 (1987) 162] and Hirayama et al. who formed wires using the doping effect by FIB [Y. Hirayama, T. Saku and Y. Hirokoshi, Phys. Rev. B 39 (1989) 5535]. The quantum doping is a concept that has been proposed by the inventor of this application for the first time through implementation of the single ion implantation system and method according to the present invention.

(3) Device Control

Studies about the influence of irradiation of semiconductor materials and devices by a particle (ion) beam have been conducted mainly in the United States for the last 20 years or so, but these studies are intended for the use of devices in outerspace, nuclear facilities and under similar specific conditions. In 1979, however, it was reported by May et al. that alpha particles emitted from radioactive elements present in very small quantities in device packaging materials induced soft errors (device malfunction caused by the incidence of one high-energy ion) even in devices used under ordinary environmental conditions [T. C. May and M. H. Woods, IEEE Trans. Electron Devices ED-26 (1979) 2]. Furthermore, it was found that this problem would become more serious with a decrease in the size of devices; thereafter, semi conduct or manufactures began to earnestly pursue research about countermeasures against soft errors.

Conventionally, the evaluation of the ion irradiation effect on the device is conducted by randomly irradiating the device with ions emitted from a radioactive element or accelerator and statistically processing the frequency of malfunction of the device [N. Shiono, Y. Sakagawa, M. Sekiguchi, K. Sato, I. Sugai, T. Hattori and Y. Hirano, IEEE Trans. Nucl. Sci. NS-33 (1986) 1632]. This method possesses, however, the fatal defect of incapability of specifying the position of incidence of an ion to the specimen surface.

The direct evaluation of the ion irradiation effect on microminiatured integrated circuits requires a technique for conducting ion irradiation with resolution on the order of micromillimeter. In 1992 Horn, Doyle et al. reported a method for evaluating the ion irradiation effect on devices through utilization of high-energy ion beams focused to micron dimensions [K. M. Horn, B. L. Doyle and F. W. Sexton, IEEE Trans. Nucl. Sci. NS-39 (1992) 7]. This method permits specifying ion-irradiated positions but stops well short of the evaluation of a transient response because the irradiation of devices with a beam-focused high-intensity ion causes irradiation damage to semiconductor materials and permanent deterioration of the devices.

The inventor of this application and his colleagues evaluated the site dependence of the single ion irradiation effect on a present VLSI by use of a single ion irradiation effect T. Matsukawa, M. Koh, K. Hara, M. Goto and I. Ohdomari, Jpn. J. Appl. Phys. 31 (1992) L771]. This is the first attempt which irradiated a commercially available VLSI with ions each at a different position or site and evaluated the effect. They succeeded in measurements of the occurrence of soft errors in each site of 2 μm square [K. Noritake, T. Matsukawa, M. Koh, K. Hara, M. Goto and I. Ohdomari, Jpn. J. Appl. Phys. 31 (1992) L771].

As described above, there have been developed so far new evaluation methods which induce soft errors by the irradiation of single ions to devices; but to achieve a direct understanding of transient response phenomena of devices and the production of indexes for the enhancement of their strength, it is necessary to examine the effects of irradiation with not only ions of helium (He) but also ions of various LETs (energies of ions lost per range) which are objects of the present invention. These objects can be attained by adding ion sources to a single ion microprobe already developed.

To obtain basic findings about transient phenomena of next generation ultrafine-microstructured devices of sizes under 0.1 μm, the introduction of a system having an aiming accuracy on the order of 10 nm is indispensable. In this respect, an extremely high precision single ion implantation system could be implemented by introducing single ion extraction and aiming techniques, obtained in the development of the single ion microprobe, into a focused ion beam (FIB) system having a probe diameter under 50 nm.

Next, a description will be given of the prior art concerning the clarification of behaviors of point defects.

As regards research on crystal defects in semiconductors, especially silicon (Si), studies centering on electron spin resonance (ESR) and electrical measurement had been conducted very actively until the 1980's during which the ion implantation method invented in the late 1960's was established as a semiconductor manufacturing technique. However, since defects become more unstable as they become smaller, behaviors of interstitial defects and vacancy defects are still left unclarified. On the other hand, from the standpoint of computational physics, the smaller the defects, the more easily they can be handled; in 1984 Car et al. reported the results of theoretical calculations about the Bourgoin mechanism of interstitial atoms in silicon (Si) [R. Car, P. J. Kelly, A. Oshiyama and S. T. Pantelides, Phys. Rev. Lett., 52 (1984) 1814], after which many results of research have been reported, including a recent report on the influence of pressure on the diffusion of a dopant in silicon (Si) [O. Sugino and A. Oshiyama, Marerials Science Forum, 83–87 (1992) 469].

The inventor of this application has already developed an ion irradiation system utilizing an ion microprobe. In Japanese Pat. Appln. No. 84904/92 filed in his name, there are disclosed a single ion irradiation system and method which enable a single ion or a predetermined number of ions to be applied an intended target point or site with high accuracy. The conventional ion irradiation system and method will be outlined below. FIG. 4 is a schematic diagram showing the principles of the prior art ion irradiation system.

The illustrated ion irradiation system is made up of: an ion microprobe for generating an ion microbeam 40; a deflector 41 for deflecting the ion microbeam 40; a beam chopper 42 for deflecting the ion microbeam 40 by the deflector 41; a micro-slit 43 for extracting therethrough a predetermined number of ions from the deflected ion microbeam; a specimen holder mechanism for holding a specimen 44 to be irradiated with ions; a secondary electron detecting system for detecting secondary electrons emitted from the specimen surface by its irradiation with ions, the secondary electron detecting system including a scanning electron microscope for observing the surface of the specimen 44 in real time. By instantaneous reversal of the direction of deflection the ion microbeam 40 with respect to the micro-slit 43 by the beam chopper 42, the predetermined number of ions are extracted through the micro-slit 43 from the ion microbeam 40, and one or more ions thus extracted are applied to the specimen surface.

The method for the operation of the above-mentioned system comprises the steps of: (1) deflecting the ion microbeam 40 in one direction to intercept it by the micro-slit 43; (2) instantaneously reversing the direction of deflection of the ion microbeam 40; and (3) detecting secondary electrons 46 emitted from the specimen 44 in a target chamber 45 by a secondary electron multiplier 47 to make sure the extraction and irradiation of the single ion.

The conventional ion irradiation system and method feature the ion generating technique with which it is possible to extract one or desired number of ions with a high degree of controlability. This is implemented by the combined use of well-known beam focusing and aiming techniques; important constituents are chopping for deflecting the ion microbeam and the slit width to extract a single ion, the micro ion beam current and the beam diameter. The inventor of this application found the conditions for extracting single ions with good controlability by repeating experiments for properly selecting the above-noted constituents. This made possible to extract a desired number of ions as well as single ions with a high degree of controlability.

Until then no proposals had been made on the system and method for extracting single ions or desired number of ions with high controllability, but the inventor of this application and his colleagues experimentally found out and made sure the method. The technique for generating one or predetermined number of ions with good controllability is not a conventionally known technique nor can it be easily obtained by combining known techniques.

With the combined use of the ion microprobe based on the known beam focusing technique and the known aiming technique for directing an ion stream to a target site, the above-mentioned ion irradiation system and method were implemented which enable a single ion or desired number of ions to be extracted with good controllability and enable the extracted single ion or desired number of extracted ions to be directed to a target site with high precision.

With the conventional ion irradiation system and method, only one ion can be directed to each site of one integrated circuit with desired energy; hence, they can be applied to the evaluation of the radiation hardness of the site by artificially causing phenomena (latch-up a CMOS, a soft error of a DRAM, etc.) through irradiation with the ion.

Since one ion can be directed to an aimed position with high accuracy, it is possible to measure the radiation hardness of a semiconductor device at each site and hence pinpoint the malfunction-prine location.

It is also possible to apply a single high-energy ion to a desired site of a target which has a microstructure, such as an LSI or chamber. Furthermore, it is possible to artificially cause malfunction of an integrated circuit by high-energy ions which naturally occur at random and infrequent intervals in ordinary use environments in the outer space or on the earth.

As the result of further development of the techniques obtained with the single ion irradiation system and method, the present inventor has developed a single ion implantation system and method.

SUMMARY OF THE INVENTION

It is therefore an object of the present invention to provide a low-energy single ion implantation system which makes use of a focused ion beam having a spot diameter of 50 nm or less and an acceleration energy in the range of 0 to 100 keV.

Another object of the present invention is to provide a high-energy single ion implantation system and method which employ a Cs sputter ion source so as to utilize the already developed single ion microprobe for dopant ion implantation and high LET ion irradiation.

To facilitate a better understanding of the present invention, technical terms used in this specification will be defined below.

The micro ion beam (MIB) and the focused ion beam (FIB) mentioned herein are both focused ion beams although there is a slight difference in nuance between the two terms; the differences between them are given in the following table.

TABLE 1

Comparison between micro ion beam and focused ion beam

| | MIB | FIM |
|---|---|---|
| Ion particle | light ion | heavy ion |
| Acceleration energy | high (~MeV) | low to medium (~hundreds of keV) |
| Beam diameter | ~1 μm | tens of nm |
| Beam parallelism | parallel | nonparallel |
| Use | analysis | fine surface machining ion implantation |

The present invention is directed to a single ion implantation system which extracts a single ion from the focused ion beam (FIB) or micro ion beam (MIB) by beam chopping.

The focused ion beam corresponds to the low-energy ion implantation and the micro ion beam the high-energy ion implantation.

The "single ion" refers to an ion which forms for a predetermined period of time immediately after the focused ion beam or micro ion beam generated as an ion stream passes through a single ion generating slit.

The single ion implantation (SII) is to implant ionized dopant atoms into a solid one by one. The acceleration energy is 1 to 4.5 MeV in the case of using the ion microprobe and 0 to 100 keV in the case of using the focused ion beam system.

The ion microprobe is a device which collimates an ion beam from an electrostatic accelerator to about lame and subjects it to Rutherford back scattering (RBS) or particle beam excited x-ray spectroscopy (PIXE).

The focused ion beam system (FIB) is a system which performs implantation, microminiature patterning and induction of local chemical reaction by use of an ion beam focused to a size smaller than submicron.

What is intended to mean by the "quantum doping" is to add the dopant atoms to a microstructure one by one; this is a technique defined by the present invention for the first time.

What is intended to mean by "trimming" in this specification is to generate a pattern of the order of 10 nm by the focused ion beam system.

STM stands for a scanning tunneling microscope.

BEEM stands for a ballistic-electron emission-microscope, which is an improvement of the scanning tunneling microscope (STM) and permits measurements of currents on the order of pA and is used to measure the two-dimensional distribution of the Schottky barrier.

What is intended to mean by "mixing" in this specification is to mix two layers forming a stacking interface through utilization of the fact that ions launched into a solid displace many atoms forming it in the vicinity of the range. When the number of ions launched into the solid is small, such a mixed region is localized.

The "positron annihilation" is a phenomenon that positrons, which are antiparticles of electrons, collide with electrons, causing pair annihilation and ejecting gamma rays. Since the positrons selectively collide with electrons captured by lattice vacancies of a crystal, the positron annihilation is used to detect lattice vacancies.

In the conventional ion implantation, too, there is a low probability of two or more ions being simultaneously incident to the same site of a solid, but Fischer of GSI succeeded in periodically launching ions, one at one site, by swinging an ion gun [B. E. Fischer, Nucl. Instr. & Merth., B54 (1991) 401]. In 1986 the inventor of this application began studies for collimating a high-energy ion beam for application to the analysis of microstructures and succeeded in focusing a 3 MeV helium ion beam to a diameter of $1.7 \times 1.9$ $\mu m^2$ (ion microprobe technique). Moreover, he developed an aiming technique which would never cause radiation damage to the target site prior to the ion irradiation [I. Ohdomari, M. Sugimori, M. Koh, K. Noritake, M. Ishikawa, H. Shimizu, R. Tanaka, T. Kamiya and N. Utsunomiya, Nucl. Instr. & Meth. B54 (1991)71]. Thereafter, he developed the technique for extracting one ion from an ion beam and applying it to a target through utilization of the principles shown in FIG. 4 and ascertained that one ion could actually be extracted. By integrating this technique with the ion microprobe technique and the aiming technique, ions of helium (He) can be applied one by one to an extremely small target site of the order of micromillimeter. It is prominent feature of the present invention to perform ion implantation by the introduction of the focused ion beam system and an improvement to ion sources.

In aspect, the present invention relates to a low-energy ion implantation system which comprises a first vacuum chamber (1), a second vacuum chamber (2) connected thereto as a specimen preparation chamber, and a focused ion beam system connected to the first vacuum chamber (1). The focused ion beam system extracts a single ion by beam chopping and decelerates the extracted single ion by a retarding electric field to make it soft-land on the specimen surface.

In another aspect, the present invention relates to a low-energy single ion implantation system which comprises, in combination, standard constituents of the focused ion beam system and constituents for single ion implantation. The standard constituents include: a liquid metal ion source (6) for specimen trimming use; an accelerator (7); a condenser lens (8); a mass spectrometer (9); an electrostatic objective lens (10); an aperture (11); a scanning deflection electrode (12); a specimen (13); an electrode (35) for generating a retarding electric field to decelerate an ion to make it soft-land on the specimen: a specimen stage (14); and a secondary electron detector (15). The constituents for single ion implantation use include: a liquid metal ion source (16) for single ion irradiation use; an accelerator (17); a condenser lens (18); an electrostatic cylindrical prism (19); an electrostatic deflector (20) for beam chopping; an aperture (21) for single ion extraction; and a secondary electron detector (15) for detecting an extracted single ion.

In another aspect, a streak camera (22) for detecting a single photon generated by the incidence of a single ion is added as another constituent for single ion implantation use.

In another aspect, the present invention relates to a high-energy single ion implantation system which uses an ion microprobe made up of an RF ion source (23), an injector (24), an accelerator (25), a switching magnet (26), an assembly of a precision quadrupole magnet (29) and a target chamber (30) with an SEM for a micro ion beam line (27), and an assembly of an RBS chamber (31) and a PIXE chamber (32) for composition analysis beam line (28), and wherein a Cs sputter ion source (33) and a switching magnet (34) are provided for dopant ion implantation and high LET ion irradiation.

With the single ion implantation system according to the present invention, ions of hydrogen (H), helium (He), oxygen (O), silicon (Si) and semiconductor dopants are extracted one by one as means for solid-state character control of a microstructure and the single ion is implanted into the specimen aiming at an extremely narrow region. The single ion implantation system employs a high-energy single ion implantation system (1 to 4.5 MeV) having an electrostatic accelerator improved to extract the single ion by beam chopping and a low-energy single ion implantation system (0 to 100 keV) having the focused ion beam system improved to permit the single ion implantation. The aiming accuracy is 1.5 $\mu m \phi$ in the former and 20 nm$\phi$ in the latter.

DESCRIPTION OF THE PREFERRED EMBODIMENT

Figure 1:
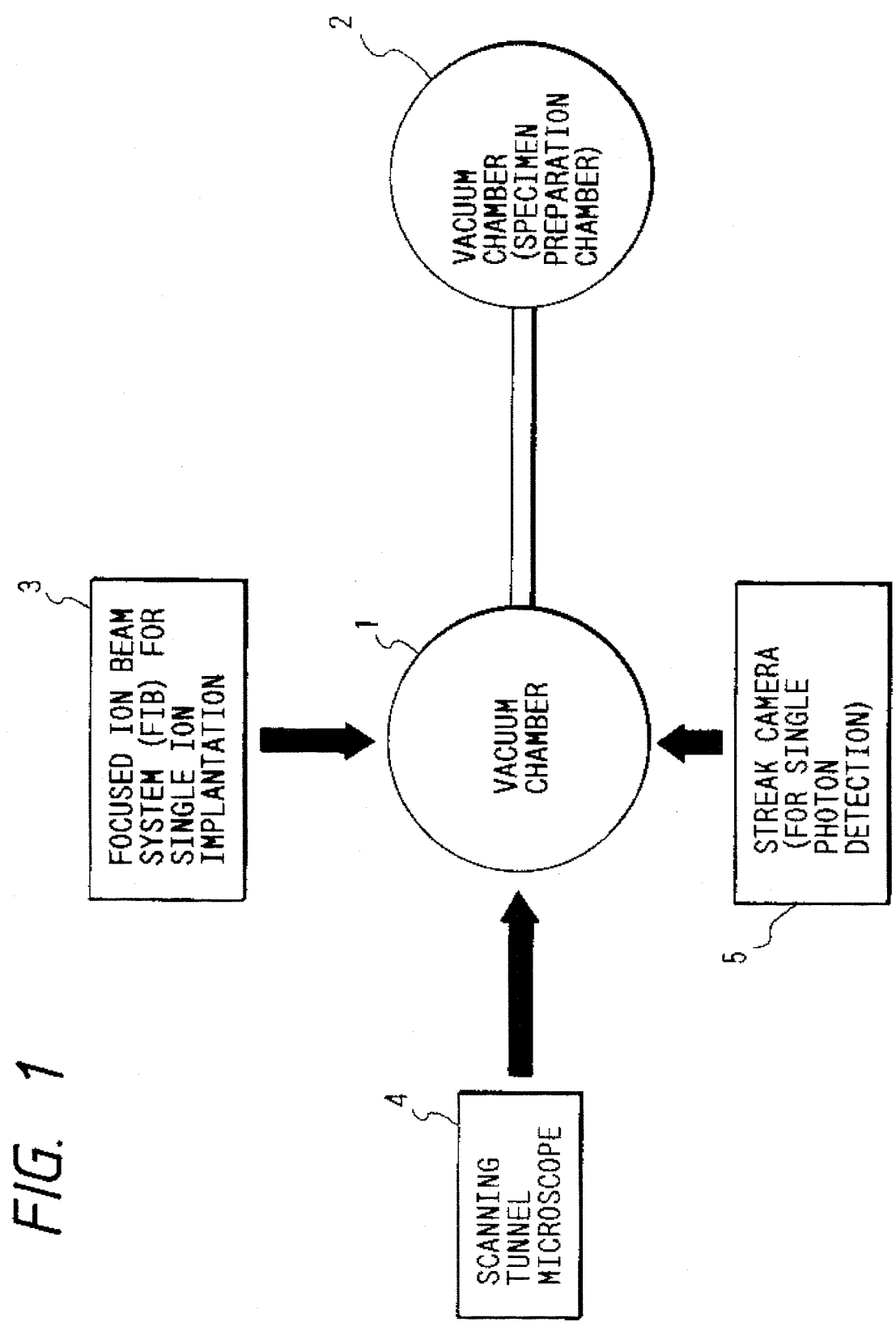
FIG. 1 is a schematic diagram showing the principles of a low-energy single ion implantation system according to a first embodiment of the present invention.

The single ion implantation system according to the present invention are implemented by a combination of three techniques, i.e. (1) ion beam focusing technique, (2) aiming technique and (3) single ion extracting technique.

(1) Ion Beam Focusing Technique

The low-energy single ion implantation system employs a focused ion beam system which provides a beam spot diameter of about 50 nm or less and an acceleration energy in the range of from 0 to 100 keV. In this instance, however, since ions of silicon (Si), gallium (Ca), boron (B), phosphorus (P), arsenic (As), antimony (Sb) and so forth are used, an E×B mass spectrometer 9 is requisite and, to avoid damage to the specimen by neutrons, an ion source for single ion irradiation use is designed so that the trajectory of ions is deflected by an electrostatic cylindrical prism 19. This allows the coexistence of the ion source for single ion irradiation and a liquid metal ion source 6 for specimen trimming use, permitting easy working of the speciment and easy single ion implantation.

The high-energy ion implantation system employs a Cs sputter ion source 33 to utilize the conventional single ion microprobe for dopant ion implantation and high LET ion irradiation.

(2) Aiming Technique

To pinpoint the position of incidence of a single ion, it is necessary to observe the specimen surface with high resolution. The low-energy single ion implantation system utilizes a secondary electron image obtainable with ion beam scanning, instead of using an scanning electron microscope.

The low-energy single ion implantation system according to the present invention employs the aiming method disclosed in respect of the high-energy (1 to 4.5 MeV) single ion irradiation system in the afore-mentioned Japanese Pat. Applin. No. 84904/92, that is, the measurement of the relative coordinates of a reference point and the position of incidence on the specimen and positioning by a high precision goniometer.

To achieve a high degree of aiming accuracy, it is necessary to take countermeasures against vibration; the low-energy single ion implantation system according to the present invention, intended to achieve aiming accuracy on the order of 10 nm, is mounted on a vibration-proof platform or pad.

(3) Single Ion Extraction Technique

The low-energy single ion implantation system adopts the single ion extracting method using ion beam chopping disclosed regarding the high-energy single ion irradiation system in the above-mentioned Japanese patent application No. 84904/92. In this instance, a deflector for beam blanking use, built in the focused ion beam system, is used as an electrostatic deflector for beam chopping.

Figure 2:
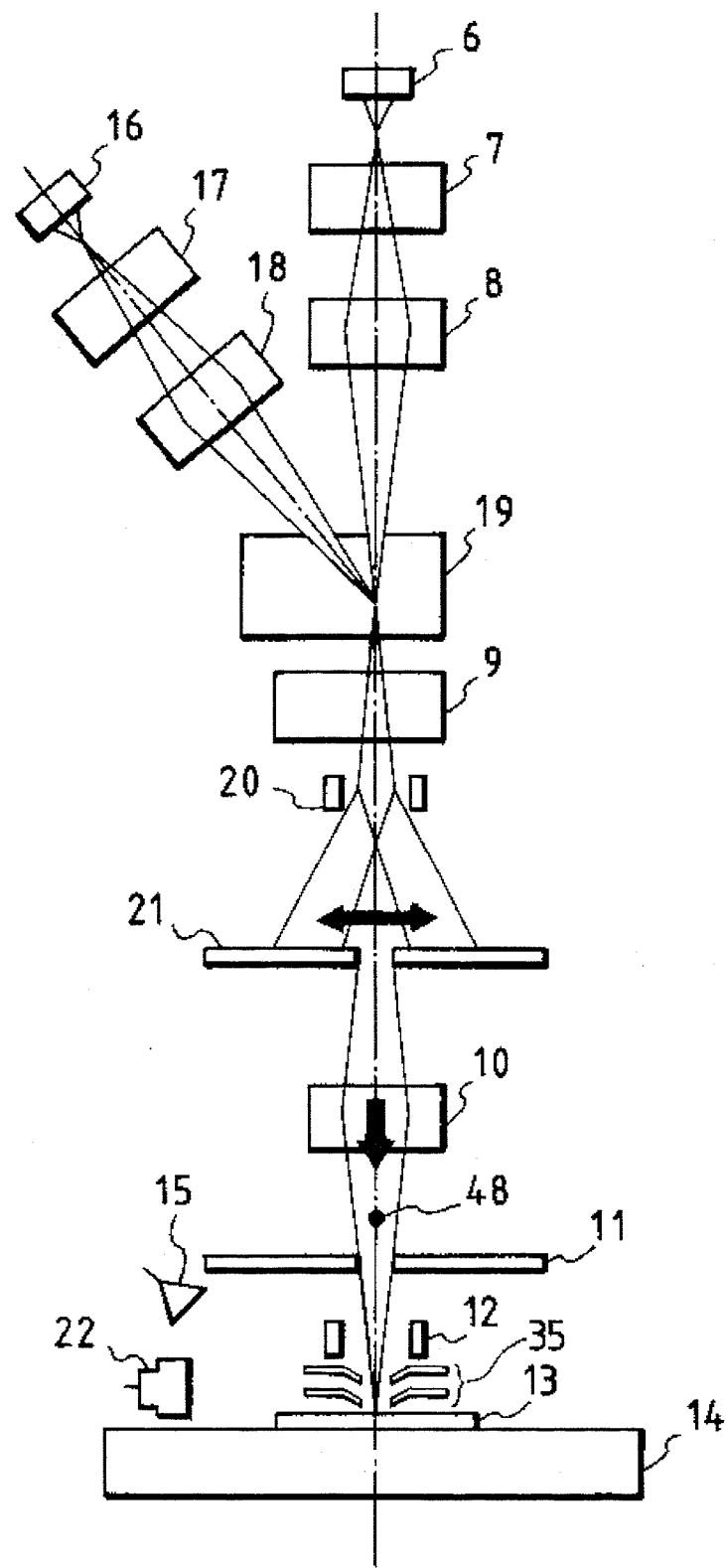
FIG. 2 is a schematic diagram showing a concrete configuration of the low-energy single ion implantation system of FIG. 1.

FIG. 1 is a schematic diagram for explaining the principles of the low-energy single ion implantation system according to a first embodiment of the present invention, and FIG. 2 illustrates its concrete system configuration. In FIG. 1, reference numeral 1 denotes a first vacuum chamber, 2 a second vacuum chamber used as a specimen preparation chamber, 3 a focused ion beam system for single ion implantation, and 4 a scanning tunneling microscope.

The first and second vacuum chamber are of the same performance, but since the second vacuum chamber 2 is added with the focused ion beam system 3 which discharges a relatively large amount of gas and the scanning tunneling microscope (STM) 4, the first vacuum chamber is used exclusively for cleaning the surface of an silicon substrate and for evaluation of the clean surface and the second vacuum chamber 2 is used for observing the specimen surface through the scanning tunneling microscope (STM) 4, trimming of a quantum fine line structure and single ion implantation.

Incidentally, the degree of vacuum of the first and second vacuum chamber 1 and 2 need not always be the ultrahigh (UHV) or extremely high vacuum (XHV) level. It is also possible to employ a structure in which the scanning tunneling microscope (STM) 4 and other necessary elements are held at the ultrahigh (UHV) or extremely high vacuum (XHV) level and to maintain the focused ion beam system (FIB) and others at an ordinary high vacuum level. Of course, the focused ion beam system (FIB) and others may be held at the ultrahigh (UHV) or extremely high vacuum (XHV) level.

FIG. 2 illustrates a concrete system configuration for extracting a single ion 48 from the focused ion beam implantation system 3. The system is composed of standard constituents of the focused ion beam system 3 and constituents for single ion implantation. The standard constituents of the focused ion beam system (FIB) are a liquid metal ion source 6 for specimen trimming use, an accelerator 7, a condenser lens 8, a mass spectrometer 9, an electrostatic objective lens 10, an aperture 11, a scanning deflection electrode 12, a specimen 13, a specimen stage 14 and a secondary electron detector 15. According to the present invention, a liquid metal ion source 16 for single ion irradiation use, an accelerator 17, a condenser lens 18, an electrostatic cylindrical prism 19, an electrostatic deflector 20 for beam chopping use, an aperture 21 for single ion extraction use and an extracted single ion 48 are provided, as single ion implanting means, in combination with the above-mentioned standard constituents. Incidentally, a streak camera 22 for single photon detection use may also be provided, though not requisite.

FIG. 2 an electrode 35, which generates a retarding electric field to make ions soft-land on the specimen surface, is provided near the specimen surface. The well-known technique for decelerating ions by the retarding electric field for soft-landing on the substance surface is disclosed in H. Sawaragi, H. Kasahara, R. Miura, W. Thompson and M. Hassel Shearer, "A focused ion beam system with a retarding mode objective lens," J. Vac Sci. Technol. B9(5), September/October 1991.

For trimming the specimen and for obtaining a secondary electron image, the focused ion beam system of the standard configuration is used. That is, an ion beam emitted from the liquid metal ion source 6 is accelerated by the accelerator 7 to a desired energy level and then focused by the condenser lens 8. Following this, ions of a desired mass number and valence are chosen and ultimately applied to the specimen, sputtering atoms in the specimen surface.

For single ion implantation, the liquid metal ion source 16 for single ion irradiation is used. The ion source 16, the accelerator 17 and the condenser lens 18 act to accelerate and focus the ion beam, whose trajectory is deflected by the electrostatic cylindrical prism 19 afterwards. The electrostatic cylindrical prism 19 serves to prevent that electrically neutral particles, which cannot be removed by the mass spectrometer 9 and is not insusceptible to the focusing action of the lens, reach the specimen during single ion implantation. An ion beam of a desired mass number and valence is selectively extracted by the mass spectrometer 9 from the ion beam having the electrically neutral particles removed therefrom as mentioned above. The single ion 48 is extracted from the ion beam by the electrostatic deflector 20 for beam chopping and the aperture 21 for single ion extraction, and the single ion 48 is applied to a desired site on the specimen.

The incidence of the extracted single ion 48 to the specimen 13 is detected by the secondary electron detector 15. A light emitting phenomenon associated with the incidence of the single ion may be detected by the streak camera 22 for single photon detection use.

Figure 3:
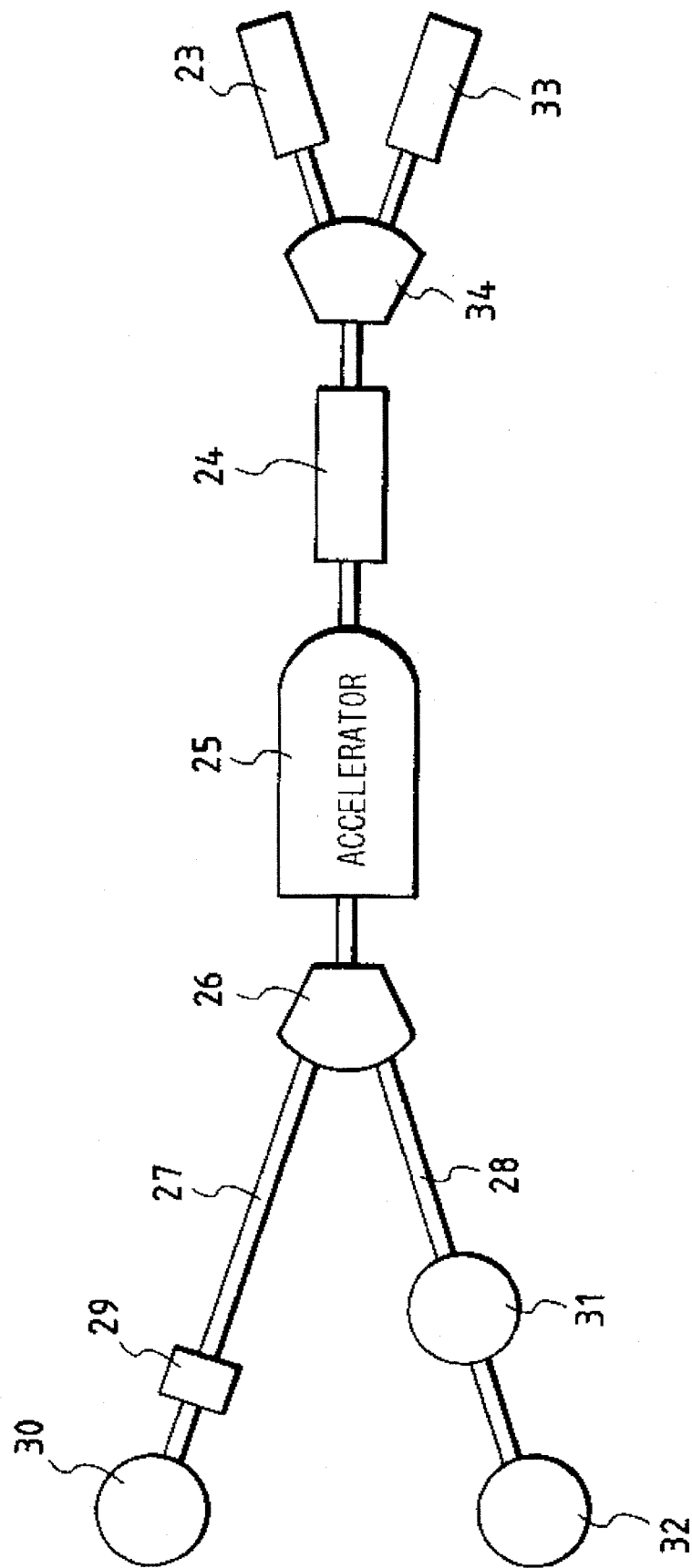
FIG. 3 is a block diagram illustrating a high-energy single ion implantation system according to a second embodiment of the present invention.
Figure 4:
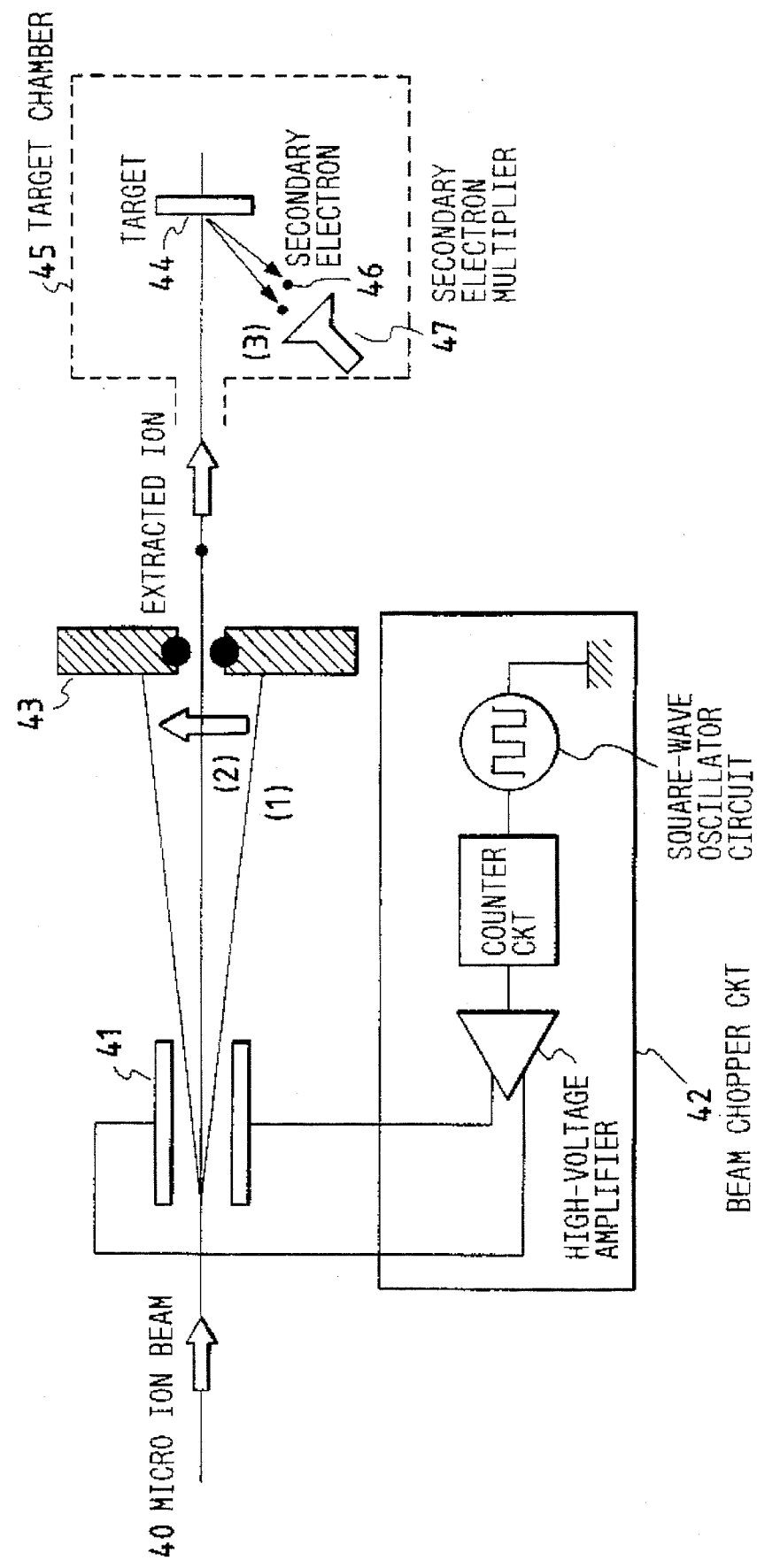
FIG. 4 is a schematic diagram showing the principles of a conventional single ion irradiation system.

FIG. 3 schematically illustrates in block form the high-energy (1 to 4 MeV) single ion implantation system according to a second embodiment of the present invention. This embodiment employs the afore-mentioned conventional single ion irradiation system which extracts a single ion by chopping a micro ion beam emitted from the ion microprobe. That is, in this embodiment a Cs sputter source 33 for dopant ion implantation and for high LET ion irradiation is added to the conventional single ion irradiation system. In utilizing the ion microprobe is provided with an RF ion source 28, an injector 24, an accelerator 25, a switching magnet 26, an assembly of a precision quadrupole magnetic lens 29 and a target chamber 20 with a scanning electron microscope for a ion micro beam line, and an assembly of an RBS chamber 81 and a PIXE chamber 32 for a composition analysis beam line. In the high-energy single ion implantation system of the present invention, the Cs sputter source 88 and a switching magnet 34 are added to the above-said conventional single ion irradiation system to implement dopant ion implantation and high LET ion irradiation. It is possible to implant single ions of various LET materials as well as helium (He) by providing their ion sources in the conventional single ion irradiation system accordingly.

The RF ion source 23 is designed primarily for ionizing hydrogen gas and helium gas and is used in the cases of low LET single ion irradiation and RBS and PIXE analyses. On the other hand, the Cs sputter source 33 is able to ionize solids and generate dopant ions and high LET ions unobtainable with the RF ion source 23. Accordingly, the Cs sputter ion source 33 is used for single ion implantation and for high LET ion irradiation. The switching magnet 34 is used not only to select one of the two ion sources but also to select a desired kind of ion beam from ion beams from the selected ion source. The ion beam thus selected by the switching magnet 34 is focused by an electrostatic lens in the injector 24 and then injected into the accelerator 25. Ions accelerated by the accelerator 25 have energies corresponding to various valences, and an energy of a desired valence is again selected by the switching magnet 26. The switching magnet 26 also switches between the composition analysis beam line 28 and the micro ion beam line 27. The composition analysis beam line 28 is used for RBS and PIXE analyses using ions of hydrogen and helium. The ion microbeam line 27 has the single ion extracting function and is used for single ion (dopant) implantation and single ion irradiation. Extracted single ions in the ion microbeam line 27 are applied by the precision quadrupole magnetic lens 29 to one point on the specimen in the target chamber 30 with and accuracy on the order of microns. The position for irradiation with ions can be determined with high accuracy by use of the scanning electron microscope attached to the target chamber 30.

To obtain basic data about transient phenomena of extremely small devices reduced down to a size under 0.1 μm, it is indispensable to introduce a device having an aiming accuracy of the order of 10 nm. According to the present invention, it is possible to implement an extremely high accuracy low-energy single ion implantation system which utilizes the focused ion beam system having a probe diameter of 50 nm or less as mentioned above, the single ion extracting technique by the single ion microprobe and the aiming technique by the high precision goniometer.

In the case of doping a semiconductor with an impurity by a conventional ion implantation or thermal diffusion process, the impurity is distributed in the semiconductor and its probability of existence can be expressed by the Poisson distribution. Letting the mean number of impurities in a very small volume be represented by $\lambda$, the probability of existence of n impurities is given as follows:

$$P(n) = e^{-\lambda} \frac{\lambda^n}{n!} \quad (1)$$

The fluctuation δ in this case is defined as follows:

$$\delta = \frac{\sqrt{\lambda}}{\lambda} = \frac{1}{\sqrt{\lambda}} \quad (2)$$

The fluctuation is inversely proportional to the square root of the mean value of the number of impurity atoms allowed to exist in the extremely small volume. Hence, as the impurity concentration decreases or as the volume of the system decreases, the mean value of the number of impurities contained in the system decreases and the fluctuation increases in :inverse proportion to the square root. In the single ion implantation method, microstructures are always doped with a fixed number of impurity atoms; hence practically no fluctuation occurs. The table below gives a comparison of the conventional method and the single ion implantation method in terms of fluctuation of the dopant number in the case of doping an extremely small resistance measuring size of 50 nm by 50 nm and 100 nm long.

TABLE 2

Comparison of the single ion implantation method and conventional method

| Dopant Density (atoms/cm$^3$) | Mean Dopant Number in Extremely Small Resistance | Fluctuation of Dopan Number (%) | |
|---|---|---|---|
| | | Conventional Method | SII (this invention) |
| 1 × 10$^{16}$ | 2.5 | 63.2 | 20(*) |
| 1 × 10$^{17}$ | 25 | 20 | 0 |
| 1 × 10$^{18}$ | 250 | 6.3 | 0 |

(*) When the mean number is 2.5, the single ion implantation method implants two or three ions; hence the deviation from the mean value is 0.5.

A description will be given of a concrete method of effecting solid-state character control of an ultrafine microstructure by use of the single ion implantation system according to the present invention.

(1) Surface Structure

① To artificially control the quantity of oxygen stored in the surface, the surface is evaluated in an extremely high vacuum of 10$^{-12}$ Torr. The present inventor's extremely high vacuum chamber is equipped with an electron gun for reflection high-energy electron diffraction, and hence permits dynamic observation of the surface. With this method, it is possible to reduce the quantity of oxygen that is adsorbed from the vacuum atmosphere.

② Based on the fact that the 1×1→7×7 structural phase transition temperature of the silicon (111) surface gradually decreased with improvements in experimental conditions, it is possible to find the relationship between the nucleation of the 7×7 structure of a low temperature phase by evaluation of the above structural phase transition in an extremely high vacuum.

③ A silicon substrate cleaned in an ultrahigh vacuum is irradiated with ions of oxygen by the low-energy single ion implantation system to induce a 7×7 structure. During irradiation the incidence energy and number of oxygen ions, the substrate temperature and the configuration of the substrate surface (the step density, the presence or absence of defects, etc.) were always observed and the correlation to the surface structural phase transition was examined by use of an STM and an RHEED for high temperature use.

④ In attempt to form a metal nucleus, ions were decelerated by a retarding electric field to soft-land on the specimen surface in the low-energy single ion implantation system. It is an important factor how the ions can be decelerated.

⑤ The thus formed nucleus is observed using the scanning tunnel microscope in the target chamber. By this, information mainly on the ion absorption site and the atomic orientation of the nucleus can be obtained.

⑥ As a theoretical approach, the mechanism of nucleation was analyzed by the method of molecular orbit. That is, it was checked how much activation energy is needed for nucleation, if a nucleus can be formed without destroying the surface, if other secondary compounds are generated and if the actually formed structure is thermally stable.

⑦ Since the image observed by the scanning tunneling microscope reflects only a local electronic state of the surface, the presence of atoms cannot directly be observed. Then, it is desirable to theoretically interpret the STM image from the molecular orbit.

(2) Interface Control

① The single ion implantation system of the present invention was used to implant an arbitrary number of ions into a metal/semiconductor interface with a high positional accuracy and the BEEM was used to measure the current-voltage characteristic and evaluate the Schottky barrier characteristic. Assuming that the incidence of ions changes the atomic orientation in the interface by and atomic displacement or mixing, a recombination center or low barrier layer proportional to the number of ions develops along the range of ions.

② Variations by heat treatment in $H_2$ and various other atmospheres are evaluated by the same method as mentioned above, whereby it is possible to quantitatively detect factors which govern the interface characteristics.

③ By implanting single ions into the gate oxide film/silicon interface of miniature MOS FET structure, it is possible to quantitatively clarify the effect of ion irradiation oil the MOS FET characteristics.

④ By heat treating the specimen of ③ in $H_2$ and various other atmospheres, it is possible to obtain data on the behavior of the interface level from the effects of the heat treatment on the MOS FET characteristics.

(3) Impurity Control

① An SIMOX-Si substrate (a substrate which has a buried $SiO_2$ region formed by high concentration oxygen ion implantation and heat treatment, leaving in the surface as thin a single-crystal layer as several nm to hundreds of nm) is trimmed by the focused ion beam to form an extremely small resistor structure. A plurality of such resistors of the same sizes except their specific resistivity by scaling are prepared. The specific resistivity is controlled by the single ion implantation.

② A similar resistor structure by the conventional ion implantation method and doping is prepared. The resistance values and noise voltage of the structures prepared by the conventional method and by the present invention are measured. According to the present invention, fluctuation of the resistance value and noise are remarkably reduced.

(4) Device Control

① Devices for use in ordinary environments were irradiated with single ions by the high-energy single ion implanting system and the ion irradiation effects of various positions were evaluated. By this, it is possible to specify the region in each device where transient phenomena by incidence of ions are likely to occur.

② Similar evaluations were made using higher LET ions and the irradiation effect was evaluated for site where soft error and similar transient phenomena were relatively hard to observe.

③ By considering the results of evaluations in ① and ② in combination with the device structures, i t is possible to indexes for increasing the resistance against transient phenomena.

④ The low-energy single ion implantation system is used to evaluate the ion irradiation effect on a microstructure of a size under 0.1 μm. The device used as the target was fabricated by implanting a dopant through use of the focused ion beam system. By using the same focused ion beam system to fabricate the device and to evaluate the ion irradiation effect, it is possible to pinpoint the precise location of irradiation with the single ion.

The present invention, viewed in its entirety, covers electronics engineering, material science, solid-state physics, quantum chemistry, radiation physics and device physics, and hence greatly contributes to the development of new cross-disciplinary scientific fields.

The present invention implements nucleation control. This completes a first step of generating a floating gate having a diameter of tens of nm in an insulator in which single electrons having passed through a tunnel junction are captured in the fabrication of an single electron transistor utilizing the tunnel effect of electrons.

Since the atomic elementary process of the interface reaction induced by the incidence of single ions is made clear, important knowledge for extremely small interface control can be obtained.

The quantum doping demonstrates, by the single ion implantation process, the argument that the impurity concentration, regarded as a continuous quantity before, becomes a discrete quantity in the microstructure. This demonstratively supports the discussion about the limit of scaling in the device physics.

The transient response of the device operation by one single ion is epoch-making in that the device operation test, for which only statitical processing after random irradiation could be resorted to in the past, can be made for each site of the device under an arbitrary biased condition.

With the single ion implantation system according to the present invention, it is possible to extract low-energy (0 to 100 KeV) single ions and implant them with an aiming accuracy of 20 nmφ, or to extract high-energy (1 to 4 MeV) single ions and implant them with an aiming accuracy of 1.5 μmφ.

According to the single ion implantation system of the present invention, surface control, interface control, impurity control and device control can be effected as condensed matter control of microstructures. Furthermore, it is a matter of course that the behavior of point defects resulting from irradiation damage by the single ion implantation can be clarified by a combination with the positron annihilation process or single photon detection.

The present invention implements, as means for solid-state character control of microstructures, the single ion implantation method which extracts ions one by one and implants them into an extremely narrow site of the specimen. According to the present invention, single ions can be implanted into the surface and an interface which are constituents of a microstructure device, an extremely small structure of a size ranging from tens of nm to hundreds of nm and a device which includes them. It is necessary to understand the relation between the ion implanting operation and its effect, but the implantation of one ion is the simplest ultimate operation, and hence is easier than any other solid-state character control means.

(i) Surface Control

With the single ion implantation system according to the present invention, the formation of a 7×7 superstructure can be controlled by irradiating the silicon (111) surface with ions of oxygen in an extremely high vacuum ($10^{-12}$ Torr).

Second, nucleation control can be effected, that is, a growing nucleus composed of particular atoms can freely be formed at an arbitrary position on the surface of a solid. When it is possible to artificially plant a nucleus in the solid surface, an extremely narrow material region can be formed two- or three-dimensionally by growing the material as an island structure through a selective chemical deposition or like method. The nucleation control can be effected by causing ions to soft-land on the solid surface by applying a retarding electric field in the low-energy single ion implantation system.

(ii) Interface Control

With the single ion implantation system according to the present invention, it is possible to generate the interface level and control local mixing by implanting single ions into the metal/semiconductor and $SiO_2$/Si interface. In the metal/semiconductor interface, a recombination current and a low barrier phase develop, introducing nonuniformity in the Schottky barrier characteristic. To avoid this, the ballistic-electron-emission microscope (BEEM) which is an interface analyzer having high space resolution (2 nm) is utilized. In the $SiO_2$/Si interface, the effect of generation of the interface level is dominant, and hence fluctuation of the electrical characteristics of an extremely small MOS FET structure can be controlled.

(iii) Impurity Control

With impurity doping by the conventional diffusion or ion implantation method, the number and position of dopants are both distributed randomly. This is the most serious cause of the fluctuation of the characteristics of an extremely small device. According to the single ion implantation system of the present invention, quantum doping of an extremely small resistor structure is carried out, that is, a predetermined number of dopant ions are implanted into such a structure, by which fluctuation of the characteristics by the fluctuation of the number of impurity atoms can be eliminated.

(iv) Device Control

The transient response phenomenon of devices, represented by soft errors, becomes more prominent as the devices become smaller; hence, this phenomenon constitutes a serious obstacle to the downsizing of the devices. With the single ion implantation system according to the present invention, ions are applied one by one to an arbitrary extremely narrow site of devices, by which it is possible to measure the kind and number of ions and the energy dependence of the transient response with high accuracy.

Since the irradiation damage in a solid by the single ion implantation becomes a factor which hinders the effect induced by the well-defined single ion implantation, the behavior of point defects may be directly measured by the positron annihilation method and the recombination process during the ion irradiation may be measured indirectly by the single photon detection. Since the focused ion beam (FIB) which is used for preparing a microstructure specimen also causes serious irradiation damage, the behavior of point defects may also be controlled by the above-said means from the viewpoint of evaluating the suitability as working means.

It will be apparent that many modifications and variations may be effected without departing from the scope of the novel concepts of the present invention.

What is claimed is:

1. A low-energy single ion implantation system comprising:

a first vacuum chamber;

a second vacuum chamber connected, as a specimen preparation chamber, to said first vacuum chamber; and a focused ion beam system connected to said first vacuum chamber;

CHARACTERIZED IN THAT said focused ion beam system extracts a single ion by beam chopping and decelerates said single ion by a retarding electric field to make it soft-land on the specimen surface.

2. A low-energy single ion implantation system comprising, in combination:

standard constituents of a focused ion beam system; and constituents for single ion implantation use;

CHARACTERIZED IN THAT;

said standard constituents includes; a liquid metal ion source for specimen trimming; and accelerator; a condenser lens; a mass spectrometer; an electrostatic objective lens; an aperture; a scanning deflection electrode; an electrode for generating a retarding electric field to decelerate an ion to make it soft-land on a specimen; a specimen stage; and a secondary electron detector; and said constituents for single ion implantation includes; a liquid metal ion source for single ion irradiation; an accelerator; a condenser lens; an electrostatic cylindrical lens; an electrostatic deflector for beam chopping; an aperture for single ion extraction; and a secondary electron detector for detecting an extracted ion.

3. The system of claim 2, CHARACTERIZED IN THAT another constituent for single ion implantation use is a streak camera for detecting a single photon generated by the incidence of a single ion.

4. A high-energy single ion implantation system which uses an ion microprobe comprising; an RF ion source; an injector; an accelerator; a switching magnet; an assembly of a precision quadrupole magnet and a target chamber with an SEM for a micro ion beam line; and an assembly of an RBS chamber and a PIXE chamber for composition analysis beam line;

CHARACTERIZED BY a Cs sputter source and a switching magnet for dopant ion implantation and high LET ion irradiation.

* * * * *